US006911871B1

(12) United States Patent
Li et al.

(10) Patent No.: US 6,911,871 B1
(45) Date of Patent: Jun. 28, 2005

(54) CIRCUIT WITH VOLTAGE CLAMPING FOR BIAS TRANSISTOR TO ALLOW POWER SUPPLY OVER-VOLTAGE

(75) Inventors: Wei Li, San Diego, CA (US); Thomas Clark Bryan, San Diego, CA (US); Zhixiang Jason Liu, San Diego, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 2 days.

(21) Appl. No.: 10/387,014

(22) Filed: Mar. 11, 2003

(51) Int. Cl.[7] .............................................. H03B 27/00
(52) U.S. Cl. ............................ 331/57; 331/34; 331/185; 327/276; 327/281
(58) Field of Search ............................ 331/57, 34, 185; 327/276, 281

(56) References Cited

U.S. PATENT DOCUMENTS 6,222,423 B1 * 4/2001 Sudjian ........................ 331/57
6,275,117 B1 * 8/2001 Abugharbieh et al. ........ 331/57

* cited by examiner

*Primary Examiner*—Arnold Kinkead
(74) *Attorney, Agent, or Firm*—Incaplaw; Terrance A. Meador

(57) ABSTRACT

A ring oscillator stage includes two differential transistor pairs configured to add an adjustable amount of delay to a differential input signal. Each differential pair is biased with a bias current transistor; the bias current transistor is "protected" by a voltage-clamping transistor that limits the drain voltage of the bias current transistor. The voltage-clamping transistors enable use of a power supply voltage ($V_{DD}$) that would otherwise exceed the reliability breakdown voltage limit of the bias current transistors.

19 Claims, 3 Drawing Sheets

CIRCUIT WITH VOLTAGE CLAMPING FOR BIAS TRANSISTOR TO ALLOW POWER SUPPLY OVER-VOLTAGE

FIELD OF THE INVENTION

The present invention relates generally to electronic circuits. More particularly, the present invention relates to CMOS differential pair circuits.

BACKGROUND OF THE INVENTION

The prior art is replete with transistor-based electronic circuits designed to support high speed data communication applications. Traditionally, transistor-based circuits that employ a certain manufacturing technology have practical limitations on the power supply voltage. In this regard, the power supply voltage should not exceed the "breakdown" voltage (which is determined by the particular manufacturing technology) for the transistors. If the breakdown voltage is exceeded, then the reliability of the transistors can be adversely affected and performance of the circuit can suffer.

In some circuits, the power supply voltage is related to the quality of the output signal(s). For example, in a ring oscillator stage, a higher power supply voltage ($V_{DD}$) results in a higher output voltage swing, which in turn corresponds to a lower amount of phase noise and improved performance. Unfortunately, circuit design restrictions do not always allow the use of an unlimited power supply voltage. Indeed, high speed circuits utilize transistors with small channel lengths; these transistors have a relatively low breakdown voltage compared to larger transistors.

Accordingly, there exists a need for circuits that can utilize higher power supplies than the transistor technology limit, while still satisfying the reliability requirements for the transistors in the circuits.

BRIEF SUMMARY OF THE INVENTION

A transistor-based electronic circuit according to the invention is designed to utilize a power supply voltage that exceeds the breakdown voltage for the given transistor technology, while still satisfying the reliability requirements for the transistors. The higher power supply voltage results in an increased output voltage swing, which corresponds to improved circuit performance (due to a reduction in output noise). This feature can be very desirable in high speed applications that require fast transistors having lower breakdown voltage ratings.

The above and other aspects of the present invention may be carried out in one form by an electronic circuit having: a differential transistor pair having a positive input node for a positive component of a differential input signal, a negative input node for a negative component of the differential input signal, and a common source node; a bias current transistor having a first drain node connected to the common source node, a first gate node for a bias voltage, and a first source node connected to a reference voltage; and a voltage-clamping transistor having a second drain node connected to the common source node, a second gate node connected to the common source node, and a second source node connected to the reference voltage.

BRIEF DESCRIPTION OF THE DRAWINGS

A more complete understanding of the present invention may be derived by referring to the detailed description and claims when considered in conjunction with the following Figures, wherein like reference numbers refer to similar elements throughout the Figures.

DETAILED DESCRIPTION OF A PREFERRED EMBODIMENT

The present invention may be described herein in terms of functional block components and various processing steps. It should be appreciated that such functional blocks may be realized by any number of hardware, software, and/or firmware components configured to perform the specified functions. In addition, those skilled in the art will appreciate that the present invention may be practiced in conjunction with any number of data communication systems and that the particular oscillator circuit described herein is merely one exemplary application for the invention.

It should be appreciated that the particular implementations shown and described herein are illustrative of the invention and its best mode and are not intended to otherwise limit the scope of the invention in any way. Indeed, for the sake of brevity, conventional aspects of the circuits (and the individual operating components of the circuits) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in a practical embodiment.

The following description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits are not adversely affected).

As used herein, a "node" means any internal or external reference point, connection point, junction, signal line, conductive element, or the like at which a given signal, logic level, voltage, data pattern, current, or quantity is present. Furthermore, two or more nodes may be realized by one physical element (and two or more signals can be multiplexed, modulated, or otherwise distinguished even though received or output at a common node).

Figure 1:
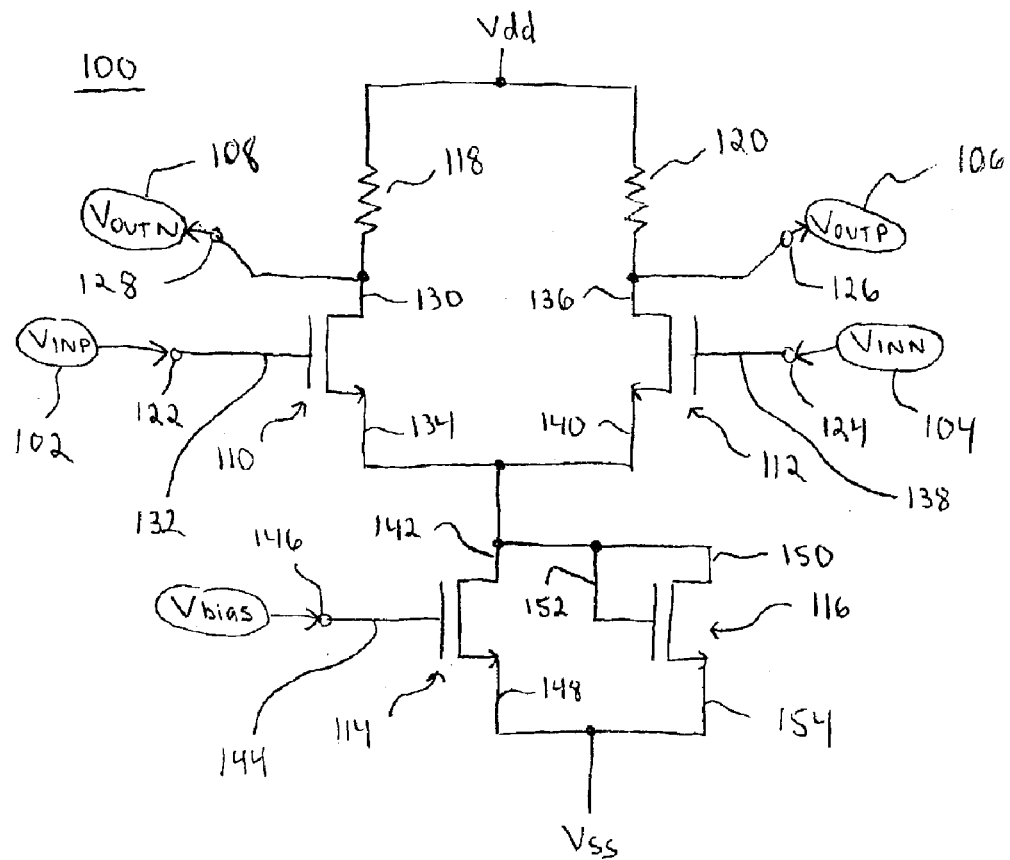
FIG. 1 is a schematic representation of a differential pair circuit having a voltage clamping feature.

FIG. 1 is a block diagram representation of a differential transistor pair circuit 100 configured in accordance with the invention. Circuit 100 can be used as a "building block" component of many different electronic circuit arrangements, subsystems, and more complex circuits. For example, one or more circuits 100 may be incorporated into a delay circuit, an oscillator circuit, a current mode logic circuit, an inverter circuit, a buffer amplifier circuit, or the like. Circuit 100 receives a differential input signal having a positive component 102 (labeled $V_{INP}$) and a negative component 104 (labeled $V_{INN}$). When active, circuit 100 generates a differential output signal having a positive component 106 (labeled $V_{OUTP}$) and a negative component 108 (labeled $V_{OUTN}$). The relative polarities of the input/output signals may be reversed depending upon the particular application. Circuit 100 generally includes a first input transistor 110, a second input transistor 112, a bias current transistor 114, a voltage-clamping transistor 116, a first load resistance 118, and a second load resistance 120. A practical embodiment of circuit 100 employs MOSFET transistors for first input transistor 110, second input transistor 112, bias current transistor 114, and voltage-clamping transistor 116. These transistors are manufactured using the same transistor technology, e.g., 0.18 micron, 0.13 micron, or the like. Equivalent differential pair circuits may be configured for operation with other transistor types and/or with other suitable active devices or switches.

Differential transistor pair circuit 100 includes a positive input node 122 for positive input component 102, and a negative input node 124 for negative input component 104. Circuit 100 also includes a positive output node 126 for positive output component 106, and a negative output node 128 for negative output component 108. In a practical ring oscillator embodiment, circuit 100 can accommodate input/output signals of up to 8 GHz. The actual frequency or frequency range of the input/output signals will be dictated by the practical application of circuit 100.

Transistor 110 and transistor 112 form a differential pair that can function as an active switching element for various circuit applications. In the practical embodiment, transistor 110 and transistor 112 are identical in nominal design. Transistor 110 has a drain node 130 connected to negative output node 128, a gate node 132 connected to positive input node 122, and a source node 134. Drain node 130 is also connected to a power supply voltage $V_{DD}$ through load resistance 118. The value of load resistance 118, which can vary from one practical application to another, is selected according to the desired output signal characteristics and according to the bias current. In the practical embodiment, drain node 130 is directly connected to, and therefore corresponds to, negative output node 128, load resistance 118 is connected between drain node 130 and $V_{DD}$, and gate node 132 is directly connected to, and therefore corresponds to, positive input signal node 122.

Transistor 112 has a drain node 136 connected to positive output node 126, a gate node 138 connected to negative input node 124, and a source node 140 connected to source node 134. Drain node 136 is also connected to $V_{DD}$ through load resistance 120. The value of load resistance 120, which can vary from one practical application to another, is selected according to the desired output signal characteristics and according to the bias current. In the preferred embodiment, load resistance 118 equals load resistance 120 to ensure symmetrical operation of differential transistor pair circuit 100. In the practical embodiment, drain node 136 is directly connected to, and therefore corresponds to, positive output node 126, load resistance 120 is connected between drain node 136 and $V_{DD}$, gate node 138 is directly connected to, and therefore corresponds to, negative input node 124, and source node 140 is directly connected to, and therefore corresponds to, source node 134. Source node 134 and source node 140 serve as a common source node for circuit 100.

Bias current transistor 114, when active, functions as a bias current source for differential pair circuit 100. Bias current transistor 114 has a drain node 142 connected to source node 134 of transistor 110 and to source node 140 of transistor 112, a gate node 144 connected to a bias control node 146, and a source node 148 connected to a reference voltage $V_{SS}$ that is less than $V_{DD}$ (e.g., $V_{SS}$ equals ground). Bias control node 146 receives a bias voltage (labeled $V_{bias}$) that controls whether bias current transistor 114 is active or inactive. In the practical embodiment, drain node 142 is directly connected to, and therefore corresponds to, both source node 134 and source node 140. In the practical embodiment, gate node 144 is directly connected to, and therefore corresponds to, bias control node 146, and source node 148 is directly connected to ground.

Voltage-clamping transistor 116 operates to protect bias current transistor 114 against an over-voltage condition that could adversely affect the reliability or performance of differential pair circuit 100. Voltage-clamping transistor 116 has a drain node 150 connected to source node 134 of transistor 110, to source node 140 of transistor 112, and to drain node 142 of bias current transistor 114. Voltage-clamping transistor 116 also has a gate node 152 that is connected to source node 134 of transistor 110, to source node 140 of transistor 112, and to drain node 142 of bias current transistor 114. Thus, drain node 150 is connected to gate node 152. Voltage-clamping transistor 116 also has a source node 154 connected to the reference voltage $V_{SS}$. In the example embodiment, source node 154 is connected to source node 148. In the practical embodiment, drain node 150 is directly connected to, and therefore corresponds to: source node 134, source node 140, drain node 142, and gate node 152. In the practical embodiment, gate node 152 is directly connected to, and therefore corresponds to: source node 134, source node 140, drain node 142, and drain node 150. In the practical embodiment, source node 154 is directly connected to ground and to source node 148.

Voltage-clamping transistor 116 is configured to provide a leakage current across bias current transistor 114. In this context, the leakage current is significantly less than the bias current that is established by bias current transistor 114. For example, in practical embodiments the bias current can be 50–100 times the leakage current. In practical embodiments, the leakage current is selected so that it does not have a significant effect on the output signal.

The leakage current causes the voltage at drain node 142 to be no greater than the breakdown voltage limit for bias current transistor. In other words, the leakage current results in a voltage drop across the load resistances 118/120 such that the bias current transistor is not overpowered. In this regard, bias current transistor 114 has a maximum drain-to-source voltage limit (determined at least in part by the transistor technology) that is indicative of reliable performance. Ideally, this maximum voltage limit should not be exceeded at any time during operation of differential pair circuit 100. Voltage-clamping transistor 116 is configured to maintain voltage at drain node 142 such that this maximum voltage limit is not exceeded, even under "worst case" conditions where the drain voltage is at its highest.

In practice, bias current transistor 114 and voltage-clamping transistor 116 are manufactured using the same transistor technology. Consequently, the maximum voltage limit for both of these transistors is the same. Voltage-clamping transistor 116 is suitably sized to provide the relatively low leakage current, and bias current transistor is suitably sized to provide the relatively high bias current. In practical embodiments, the size of bias current transistor 114, the bias voltage, and the bias current are determined by the overall design of the circuit 100. Assuming that $$\frac{I_{bias}}{I_{leakage}} = R,$$

where R is a desired ratio, then the relative size of voltage-clamping transistor 116 can be determined according to the following relationship:

$$\frac{I_{bias}}{I_{leakage}} = \frac{size_{bias}}{size_{clamp}} \times \left(\frac{V_{BIAS}}{V_{LIMIT}}\right)^2 = R.$$

Here, $V_{LIMIT}$ represents the maximum voltage that can be applied to a transistor manufactured in accordance with the given process technology. Thus, the size of voltage-clamping transistor 116 can be calculated using this expression.

Figure 2:
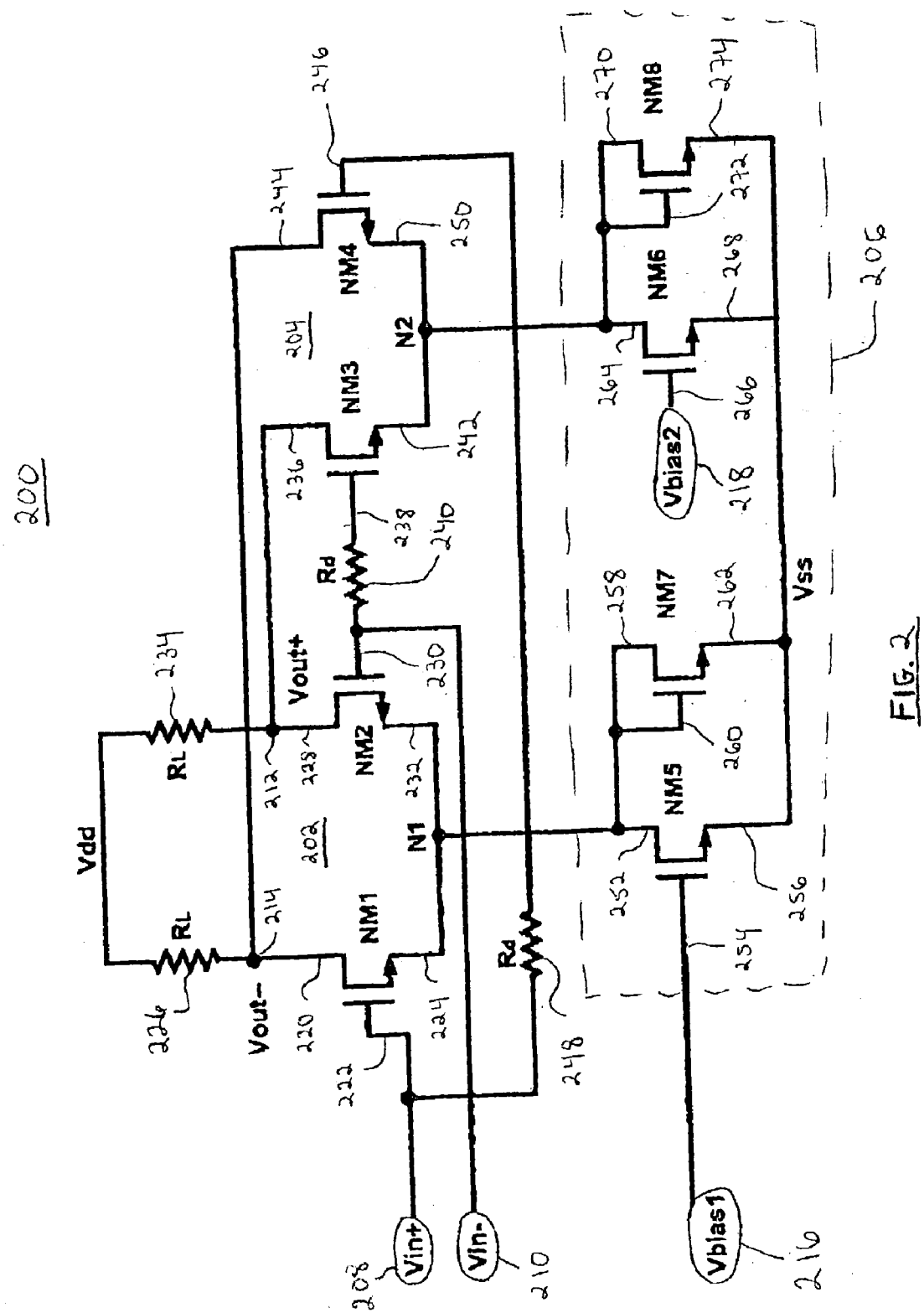
FIG. 2 is a schematic representation of a ring oscillator stage having a voltage clamping feature.

FIG. 2 is a schematic representation of a ring oscillator stage 200 that includes a voltage clamping feature for protection of bias current transistors. Ring oscillator stage 200 can be generally separated into a first differential pair 202, a second differential pair 204, and an adjustable bias current architecture 206. In the example embodiment, first differential pair 202 includes two transistors (labeled NM1 and NM2), second differential pair 204 includes two transistors (labeled NM3 and NM4), and bias current architecture 206 includes four transistors (labeled NM5, NM6, NM7, and NM8). First differential pair 202 is connected to second differential pair 204, and bias current architecture 206 is connected to both differential pairs 202/204. A practical embodiment of ring oscillator stage 200 employs MOSFET transistors for transistors NM1–NM8. Equivalent circuits may be configured for operation with other transistor types and/or with other suitable active devices or switches.

Circuit 200 includes a positive input signal node 208 for a positive component ($V_{IN+}$) of a differential input signal, and a negative input signal node 210 for a negative component ($V_{IN-}$) of the differential input signal. Circuit 200 also includes a positive output signal node 212 for a positive component ($V_{OUT+}$) of a differential output signal, and a negative output signal node 214 for a negative component ($V_{OUT-}$) of the differential output signal. Circuit 200 may also include a first bias control node 216 and a second bias control node 218 for bias control signals (e.g., bias voltages).

Transistors NM1 and NM2 form differential pair 202, which functions as an active switching element for ring oscillator stage 200. In the practical embodiment, transistors NM1 and NM2 are identical in nominal design. Transistor NM1 has a drain node 220 connected to negative output signal node 214, a gate node 222 connected to positive input signal node 208, and a source node 224. Drain node 220 is also connected to a reference supply voltage $V_{DD}$ through a resistance 226. Gate node 222 serves as a positive input node for differential pair 202. The value of resistance 226, which can vary from one practical application to another, is selected according to the desired peak-to-peak output voltage swing and according to the desired current generated by bias current architecture 206. In the practical embodiment, drain node 220 is directly connected to, and therefore corresponds to, negative output signal node 214, resistance 226 is connected between drain node 220 and $V_{DD}$, and gate node 222 is directly connected to, and therefore corresponds to, positive input signal node 208.

Transistor NM2 has a drain node 228 connected to positive output signal node 212, a gate node 230 connected to negative input signal node 210, and a source node 232 connected to source node 224. Drain node 228 is also connected to $V_{DD}$ through a resistance 234. Gate node 230 serves as a negative input node for differential pair 202. The value of resistance 234, which can vary from one practical application to another, is selected according to the desired peak-to-peak output voltage swing and according to the desired current generated by bias current architecture 206. In the preferred embodiment, resistance 226 equals resistance 234 to ensure symmetrical operation of differential pair 202. In the practical embodiment, drain node 228 is directly connected to, and therefore corresponds to, positive output signal node 212, resistance 234 is connected between drain node 228 and $V_{DD}$, gate node 230 is directly connected to, and therefore corresponds to, negative input signal node 210, and source node 232 is directly connected to, and therefore corresponds to, source node 224. Thus, source node 232 and source node 224 form a common source node for differential pair 202.

Transistors NM3 and NM4 form differential pair 204, which functions as an active switching element for ring oscillator stage 200. In the practical embodiment, transistors NM3 and NM4 are identical in nominal design. In the preferred embodiment, transistors NM1–NM4 are identical in nominal design. Transistor NM3 has a drain node 236 connected to drain node 228 of transistor NM2, a gate node 238 connected to gate node 230 of transistor NM2 through a resistance 240, and a source node 242. Drain node 236 is also connected to positive output signal node 212 and to $V_{DD}$ through resistance 234. In the practical embodiment, drain node 236 is directly connected to, and therefore corresponds to, both positive output signal node 212 and drain node 228. In the practical embodiment, resistance 234 is connected between drain node 236 and $V_{DD}$, one end of resistance 240 is directly connected to gate node 238, and the other end of resistance 240 is directly connected to both gate node 230 of transistor NM2 and to negative input signal node 210. The value of resistance 240, which can vary from one practical application to another, is selected according to the desired delay range of ring oscillator stage 200.

Transistor NM4 has a drain node 244 connected to drain node 220 of transistor NM1, a gate node 246 connected to gate node 222 of transistor NM1 through a resistance 248, and a source node 250 connected to source node 242 of transistor NM3. Drain node 244 is also connected to negative output signal node 214 and to $V_{DD}$ through resistance 226. In the practical embodiment, drain node 244 is directly connected to, and therefore corresponds to, both negative output signal node 214 and drain node 220. In the practical embodiment, source node 250 is directly connected to, and therefore corresponds to, source node 242 of transistor NM3, resistance 226 is connected between drain node 244 and $V_{DD}$, one end of resistance 248 is directly connected to gate node 246, and the other end of resistance 248 is directly connected to both gate node 222 of transistor NM1 and to positive input signal node 208. The value of resistance 248, which can vary from one practical application to another, is selected according to the desired delay range of ring oscillator stage 200. In the preferred embodiment, resistance 240 equals resistance 248 to ensure symmetrical/balanced operation of differential pair 204.

Gate node 222 of transistor NM1 serves as a positive input node for differential pair 202, and gate node 230 of transistor NM2 serves as a negative input node for differential pair 202. Drain node 220 of transistor NM1 serves as a negative output node for differential pair 202, and drain node 228 of transistor NM2 serves as a positive output node for differential pair 202. Source node 224 of transistor NM1 and source node 232 of transistor NM2 serve as a common source node for differential pair 202. Likewise, gate node 238 of transistor NM3 serves as a negative input node for differential pair 204, and gate node 246 of transistor NM4 serves as a positive input node for differential pair 204. Drain node 236 of transistor NM3 serves as a positive output node for differential pair 204, and drain node 244 of transistor NM4 serves as a negative output node for differential pair 204. Source node 242 of transistor NM3 and source node 250 of transistor NM4 serve as a common source node for differential pair 204.

Transistor NM5 is a bias current transistor for differential pair 202. Transistor NM5 has a drain node 252 connected to source node 224 of transistor NM1 and to source node 232 of transistor NM2, a gate node 254 connected to bias control node 216, and a source node 256 connected to a reference voltage $V_{SS}$ that is less than $V_{DD}$ (for example, $V_{SS}$ can represent ground). In the practical embodiment, drain node 252 is directly connected to, and therefore corresponds to, both source node 224 and source node 232. In the practical embodiment, gate node 254 is directly connected to, and therefore corresponds to, bias control node 216, and source node 256 is directly connected to $V_{SS}$.

Transistor NM7 functions as a voltage-clamping transistor that protects transistor NM5 against an over-voltage condition that could adversely affect the reliability or performance of ring oscillator stage 200. Transistor NM7 has a drain node 258 connected to source node 224 of transistor NM1, to source node 232 of transistor NM2, and to drain node 252 of transistor NM5. Transistor NM7 also has a gate node 260 that is connected to source node 224 of transistor NM1, to source node 232 of transistor NM2, and to drain node 252 of transistor NM5. Thus, drain node 258 is connected to gate node 260. Transistor NM7 also has a source node 262 connected to the reference voltage $V_{SS}$. In the example embodiment, source node 262 is connected to source node 256. In the practical embodiment, drain node 258 is directly connected to, and therefore corresponds to: source node 224, source node 232, drain node 252, and gate node 260. In the practical embodiment, gate node 260 is directly connected to, and therefore corresponds to: source node 224, source node 232, drain node 252, and drain node 258. In the practical embodiment, source node 262 is directly connected to $V_{SS}$ and to source node 256.

The physical and operating characteristics of transistors NM5 and NM7, and the manner in which transistor NM7 protects transistor NM5, are similar to that described above in connection with bias current transistor 114 and voltage-clamping transistor 116 (see FIG. 1).

Transistor NM6 is a bias current transistor for differential pair 204. Transistor NM6 has a drain node 264 connected to source node 242 of transistor NM3 and to source node 250 of transistor NM4, a gate node 266 connected to bias control node 218, and a source node 268 connected to reference voltage $V_{SS}$. In the practical embodiment, drain node 264 is directly connected to, and therefore corresponds to, both source node 242 and source node 250. In the practical embodiment, gate node 266 is directly connected to, and therefore corresponds to, bias control node 218, and source node 268 is directly connected to $V_{SS}$.

Transistor NM8 functions as a voltage-clamping transistor that protects transistor NM6 against an over-voltage condition that could adversely affect the reliability or performance of ring oscillator stage 200. Transistor NM8 has a drain node 270 connected to source node 242 of transistor NM3, to source node 250 of transistor NM4, and to drain node 264 of transistor NM6. Transistor NM8 also has a gate node 272 that is connected to source node 242 of transistor NM3, to source node 250 of transistor NM4, and to drain node 264 of transistor NM6. Thus, drain node 270 is connected to gate node 272. Transistor NM8 also has a source node 274 connected to the reference voltage $V_{SS}$. In the example embodiment, source node 274 is connected to source node 268. In the practical embodiment, drain node 270 is directly connected to, and therefore corresponds to: source node 242, source node 250, drain node 264, and gate node 272. In the practical embodiment, gate node 272 is directly connected to, and therefore corresponds to: source node 242, source node 250, drain node 264, and drain node 270. In the practical embodiment, source node 274 is directly connected to $V_{SS}$ and to source node 268.

The physical and operating characteristics of transistors NM6 and NM8, and the manner in which transistor NM8 protects transistor NM6, are similar to that described above in connection with bias current transistor 114 and voltage-clamping transistor 116 (see FIG. 1).

Bias control node 216 receives a first bias voltage (labeled $V_{bias1}$), and bias control node 218 receives a second bias voltage (labeled $V_{bias2}$). The bias voltages respectively control activation of transistors NM5 and NM6. In this regard, bias current architecture 206 can control whether transistors NM1 and NM2 are fully active, inactive, or partially active, and whether transistors NM3 and NM4 are fully active, inactive, or partially active. The bias voltages control the delay introduced by ring oscillator stage 200. If transistor NM5 is activated and transistor NM6 is deactivated, then the amount of delay is relatively small. If transistor NM5 is deactivated and transistor NM6 is activated, then the amount of delay is relatively large. If transistor NM5 and transistor NM6 are both partially activated, then the amount of delay is relatively intermediate, depending upon the relative contributions of differential pairs 202/204.

In practical embodiments, $V_{DD}$ can be a voltage that would otherwise exceed the breakdown voltage of the transistors in ring oscillator stage 200. For example, the reliability voltage limit for 0.13 micron technology transistors is approximately 1.2 volts. The configuration of ring oscillator stage 200 enables use of a $V_{DD}$ voltage that exceeds this limit, e.g., 1.8 volts. During operation of ring oscillator stage 200, the voltage at the common source nodes (labeled nodes N1 and N2) can be approximately equal to $V_{DD}$ at certain times. If a relatively high $V_{DD}$ voltage (e.g., a voltage that exceeds the breakdown voltage limit) is employed, then the bias current transistors can be overdriven to the point of unreliable operation. As mentioned above, a higher supply voltage may be desirable in certain applications that call for a higher output voltage swing. The voltage-clamping transistors ensure that the voltage at nodes N1 and N2 does not exceed the breakdown voltage limit for the bias current transistors.

Figure 3:
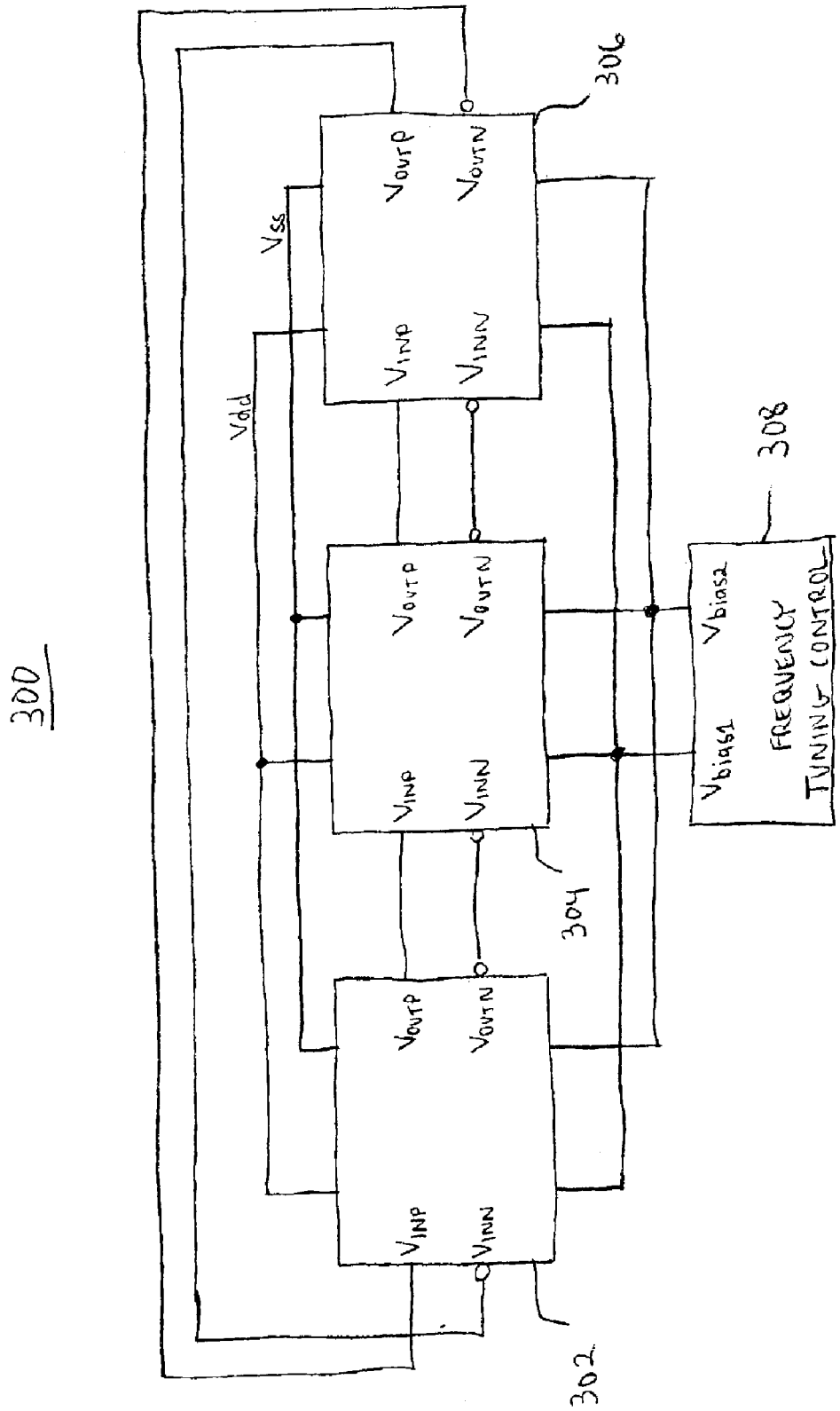
FIG. 3 is a schematic representation of a ring oscillator circuit.

FIG. 3 is a schematic representation of a ring oscillator circuit 300 that can incorporate the circuits described above. Ring oscillator circuit 300 includes a first stage 302, a second stage 304, and a third stage 306, all connected in series. Ring oscillator circuit 300 also includes a frequency tuning control element 308. In one practical embodiment, ring oscillator stage 200 (see FIG. 2) can be employed for each stage in ring oscillator circuit 300. Accordingly, each stage includes a positive input node for the positive component of a differential input signal ($V_{INP}$), a negative input node for the negative component of the differential input signal ($V_{INN}$), a positive output node for the positive component of a differential output signal ($V_{OUTP}$), a negative output node for the negative component of the differential output signal ($V_{OUTN}$), a first supply voltage node (for $V_{DD}$), a second supply voltage node (for $V_{SS}$), a first bias voltage node (for $V_{bias1}$), and a second bias voltage node (for $V_{bias2}$).

The positive output node of first stage 302 is connected to the positive input node of second stage 304, and the negative output node of first stage 302 is connected to the negative input node of second stage 304. The positive output node of second stage 304 is connected to the positive input node of third stage 306, and the negative output node of second stage 304 is connected to the negative input node of third stage 306. To complete the ring, the positive output node of third stage 306 is connected to the negative input node of first stage 302, and the negative output node of third stage 306 is connected to the positive input node of first stage 302. Thus, the output of third stage 306 is inverted and fed back as an input to first stage 302. In this context, first stage 302 is the initial stage and third stage 306 is the final stage. In other embodiments, more or less than three ring oscillator stages can be used.

In the example embodiment, each ring oscillator stage shares a common $V_{DD}$ voltage, a common $V_{SS}$ voltage, a common $V_{bias1}$ voltage, and a common $V_{bias2}$ voltage. The $V_{DD}$ voltage may be higher than the breakdown voltage limit associated with the transistors incorporated into the ring oscillator stages. Frequency tuning control element 308 is suitably configured to generate the two bias voltages for the ring oscillator stages. Control element 308 can adjust the $V_{bias1}$ voltage and/or the $V_{bias2}$ voltage as necessary such that ring oscillator circuit oscillates at the desired frequency.

The present invention has been described above with reference to a preferred embodiment. However, those skilled in the art having read this disclosure will recognize that changes and modifications may be made to the preferred embodiment without departing from the scope of the present invention. These and other changes or modifications are intended to be included within the scope of the present invention, as expressed in the following claims.

What is claimed is:

1. An electronic circuit comprising:
    a differential transistor pair having a positive input node for a positive component of a differential input signal, a negative input node for a negative component of said differential input signal, and a common source node;
    a bias current transistor having a first drain node connected to said common source node, a first gate node for a bias voltage, and a first source node connected to a reference voltage; and
    a voltage-clamping transistor having a second drain node connected to said common source node, a second gate node connected to said common source node, and a second source node connected to said reference voltage wherein said voltage clamping transistor is configured to provide a leakage current across said bias current transistor.

2. An electronic circuit according to claim 1, wherein said differential transistor pair comprises:
    a first input transistor having a third drain node connected to a power supply voltage, a third gate node connected to said positive input node, and a third source node connected to said common source node; and
    a second input transistor having a fourth drain node connected to said power supply voltage, a fourth gate node connected to said negative input node, and a fourth source node connected to said common source node.

3. An electronic circuit according to claim 2, wherein:
    said third drain node is connected to said power supply voltage through a first load resistance; and
    said fourth drain node is connected to said power supply voltage through a second load resistance.

4. An electronic circuit according to claim 2, wherein:
    said third gate node corresponds to said positive input node; and
    said fourth gate node corresponds to said negative input node.

5. An electronic circuit according to claim 2, wherein:
    said third source node corresponds to said common source node; and
    said fourth source node corresponds to said common source node.

6. An electronic circuit according to claim 1, wherein said reference voltage is ground.

7. An electronic circuit according to claim 1, wherein:
    said bias current transistor has a maximum drain-to-source voltage limit indicative of reliable performance of said bias current transistor; and
    said voltage-clamping transistor is configured to maintain voltage at said first drain node such that said maximum drain-to-source voltage limit is not exceeded.

8. An electronic circuit according to claim 7, wherein said voltage-clamping transistor has said maximum drain-to-source voltage limit, which is also indicative of reliable performance of said voltage-clamping transistor.

9. An electronic circuit according to claim 1, wherein:
    said bias current transistor provides a bias current for said differential transistor pair; and
    said leakage current is significantly less than said bias current.

10. An electronic circuit comprising:
    a first differential pair having a first positive input node, a first negative input node, a first positive output node, a first negative output node, and a first common source node;
    a second differential pair having a second positive input node, a second negative input node, a second positive output node connected to said first positive output node, a second negative output node connected to said first negative output node, and a second common source node;
    a first resistance connected between said first positive input node and said second positive input node;
    a second resistance connected between said first negative input node and said second negative input node;
    a first bias current transistor having a first drain node connected to said first common source node, a first gate node for a first bias voltage, and a first source node connected to a reference voltage; and
    a first voltage-clamping transistor having a second drain node connected to said first common source node, a second gate node connected to said first common source node, and a second source node connected to said reference voltage.

11. An electronic circuit according to claim 10, further comprising:
    a second bias current transistor having a third drain node connected to said second common source node, a third gate node for a second bias voltage, and a third source node connected to a reference voltage; and
    a second voltage-clamping transistor having a fourth drain node connected to said second common source node, a fourth gate node connected to said second common source node, and a fourth source node connected to said reference voltage.

12. An electronic circuit according to claim 11, wherein:
said first differential transistor pair comprises:
  a first input transistor having a fifth drain node connected to a power supply voltage, a fifth gate node corresponding to said first positive input node, and a fifth source node corresponding to said first common source node; and
  a second input transistor having a sixth drain node connected to said power supply voltage, a sixth gate node corresponding to said first negative input node, and a sixth source node corresponding to said first common source node; and
said second differential transistor pair comprises:
  a third input transistor having a seventh drain node connected to said power supply voltage, a seventh gate node corresponding to said second positive input node, and a seventh source node corresponding to said second common source node; and
  a fourth input transistor having an eighth drain node connected to said power supply voltage, an eighth gate node corresponding to said second negative input node, and an eighth source node corresponding to said second common source node.

13. An electronic circuit according to claim 12, wherein:
said fifth drain node is connected to said power supply voltage through a first load resistance;
said sixth drain node is connected to said power supply voltage through a second load resistance;
said seventh drain node is connected to said power supply voltage through said first load resistance; and
said eighth drain node is connected to said power supply voltage through said second load resistance.

14. An electronic circuit according to claim 10, wherein said reference voltage is ground.

15. An electronic circuit according to claim 10, wherein:
said first bias current transistor has a maximum drain-to-source voltage limit indicative of reliable performance of said first bias current transistor; and
said first voltage-clamping transistor is configured to maintain voltage at said first drain node such that said maximum drain-to-source voltage limit is not exceeded.

16. An electronic circuit according to claim 15, wherein said first voltage-clamping transistor has said maximum drain-to-source voltage limit, which is also indicative of reliable performance of said first voltage-clamping transistor.

17. An electronic circuit according to claim 10, wherein said first voltage clamping transistor is configured to provide a leakage current across said first bias current transistor.

18. An electronic circuit according to claim 17, wherein:
said first bias current transistor provides a bias current for said first differential transistor pair; and
said leakage current is significantly less than said bias current.

19. A ring oscillator circuit comprising:
a plurality of series-connected oscillator stages, each having a positive input node, a negative input node, a positive output node, a negative output node, a power supply voltage node, a reference voltage node, a first bias voltage node, and a second bias voltage node, said plurality of series-connected oscillator stages including at least an initial oscillator stage and a final oscillator stage; and
a frequency tuning controller connected to said plurality of series-connected oscillator stages, said frequency tuning controller being configured to generate a first bias voltage for said first bias voltage node and a second bias voltage for said second bias voltage node; wherein
said positive output node of said final oscillator stage is connected to said negative input node of said initial oscillator stage;
said negative output node of said final oscillator stage is connected to said positive input node of said initial oscillator stage; and
each of said plurality of series-connected oscillator stages comprises:
  a differential transistor pair having a first input node for a positive component of a differential input signal, a second input node for a negative component of said differential input signal, and a common source node;
  a bias current transistor having a first drain node connected to said common source node, a first gate node for said first bias voltage or said second bias voltage, and a first source node connected to a reference voltage; and
  a voltage-clamping transistor having a second drain node connected to said common source node, a second gate node connected to said common source node, and a second source node connected to said reference voltage.

* * * * *